United States Patent
Yang et al.

(10) Patent No.: US 6,415,087 B1
(45) Date of Patent: Jul. 2, 2002

(54) POLISHED FUSED OPTICAL FIBER ENDFACE

(75) Inventors: Thomas Chaodung Yang, North Chelmsford; Lee-Ching Hwu, Carlisle; Steven David Conover, Chelmsford, all of MA (US)

(73) Assignee: Corning Laserton, Inc., Bedford, MA (US)

( * ) Notice: Subject to any disclaimer, the term of this patent is extended or adjusted under 35 U.S.C. 154(b) by 0 days.

(21) Appl. No.: 09/189,644

(22) Filed: Nov. 10, 1998

Related U.S. Application Data

(63) Continuation-in-part of application No. 08/965,798, filed on Nov. 7, 1997, now Pat. No. 6,137,938.
(60) Provisional application No. 60/048,573, filed on Jun. 4, 1997.

(51) Int. Cl.[7] .................................................. G02B 6/02
(52) U.S. Cl. ............................ 385/123; 385/38; 385/43
(58) Field of Search ........................... 385/123, 38, 78, 385/43, 33

(56) References Cited

U.S. PATENT DOCUMENTS

| | | | |
|---|---|---|---|
| 4,418,500 A | 12/1983 | Dholakia et al. | 51/125.5 |
| 4,490,020 A | 12/1984 | Sakaguchi et al. | 350/96.18 |
| 4,701,011 A | 10/1987 | Emkey et al. | 350/96.18 |
| 4,766,705 A | 8/1988 | Dholakia | 51/328 |
| 4,812,002 A | 3/1989 | Kato et al. | 350/96.18 |
| 4,818,263 A | 4/1989 | Mitch | 65/2 |
| 4,932,989 A | 6/1990 | Presby | 65/2 |
| 5,011,254 A | 4/1991 | Edwards et al. | 350/96.18 |
| 5,018,817 A | * 5/1991 | Suzuki et al. | 385/49 |
| 5,037,174 A | 8/1991 | Thompson | 385/33 |
| 5,101,457 A | 3/1992 | Blonder et al. | 385/33 |
| 5,131,745 A | 7/1992 | Whitney et al. | 356/153 |
| 5,155,631 A | 10/1992 | Snyder et al. | 359/708 |
| 5,202,948 A | 4/1993 | Suhara et al. | 385/131 |
| 5,256,851 A | 10/1993 | Presby | 219/121.69 |
| 5,293,438 A | 3/1994 | Konno et al. | 385/35 |
| 5,402,510 A | 3/1995 | Kalonji et al. | 385/33 |
| 5,434,940 A | 7/1995 | Roff et al. | 385/91 |
| 5,447,464 A | 9/1995 | Franklin et al. | 451/28 |
| 5,455,879 A | 10/1995 | Modavis et al. | 385/33 |

(List continued on next page.)

FOREIGN PATENT DOCUMENTS

| | | | |
|---|---|---|---|
| EP | 0 086 155 | 8/1983 | B24B/19/00 |
| EP | 0 294 650 A2 | 5/1988 | B24B/19/22 |
| EP | 0 712 014 A1 | 5/1996 | G02B/6/26 |
| EP | 0 722 105 A1 | 7/1996 | G02B/6/42 |
| JP | 54 01 9762 | 2/1979 | G02B/5/14 |
| JP | 58079210 | 5/1983 | G02B/7/26 |
| WO | WO 97/42533 | 11/1997 | G02B/6/26 |

OTHER PUBLICATIONS

"Advanced Capabilities in Fiberoptic Packaging," *Fiberoptic Product News, Special Feature* (May, 1996).
Shah, Virenda S., et al., "Efficient Power Coupling from a 980–nm, Broad–Area Laser to a Single–Mode Fiber Using a Wedge–Shaped Fiber Endface," *Journal of Lightwave Technology IEEE*, vol. 8, No. 9, 1990, pp. 1313–1318 (1990).

*Primary Examiner*—Ellen E. Kim
(74) *Attorney, Agent, or Firm*—Hamilton, Brook, Smith & Reynolds, P.C.

(57) ABSTRACT

An endface configuration of an optical fiber has a frustum region which is produced by polishing the endface. In order to produce the optimal rounded tip, however, the polished fiber is then fused. To increase coupling efficiency, the vertex angle of the polished frustum region is acute, preferably between 16 and 20°. Further, to create a hyperbolic endface surface, an intermediate frustum region is preferably polished prior to fusing tip. This fused tip is preferably has a circular cross-section.

34 Claims, 13 Drawing Sheets

U.S. PATENT DOCUMENTS

| | | |
|---|---|---|
| 5,459,803 A | 10/1995 | Yamane et al. ............... 385/33 |
| 5,463,709 A | 10/1995 | Terao et al. .................. 385/85 |
| 5,526,452 A | 6/1996 | Dannoux et al. ............. 385/39 |
| 5,559,916 A | 9/1996 | Terao et al. .................. 385/85 |
| 5,563,969 A * | 10/1996 | Honmou ....................... 385/35 |
| 5,601,474 A | 2/1997 | Takahashi .................... 451/28 |
| 5,638,471 A | 6/1997 | Semo et al. .................. 385/33 |
| 5,683,290 A * | 11/1997 | Kanda et al. ................. 451/72 |
| 5,720,653 A | 2/1998 | Miller et al. ................ 451/278 |
| 5,743,787 A | 4/1998 | Ishiyama et al. ............ 451/41 |
| 5,812,722 A * | 9/1998 | Anazawa et al. ........... 385/123 |

* cited by examiner

ROUGH POLISHING

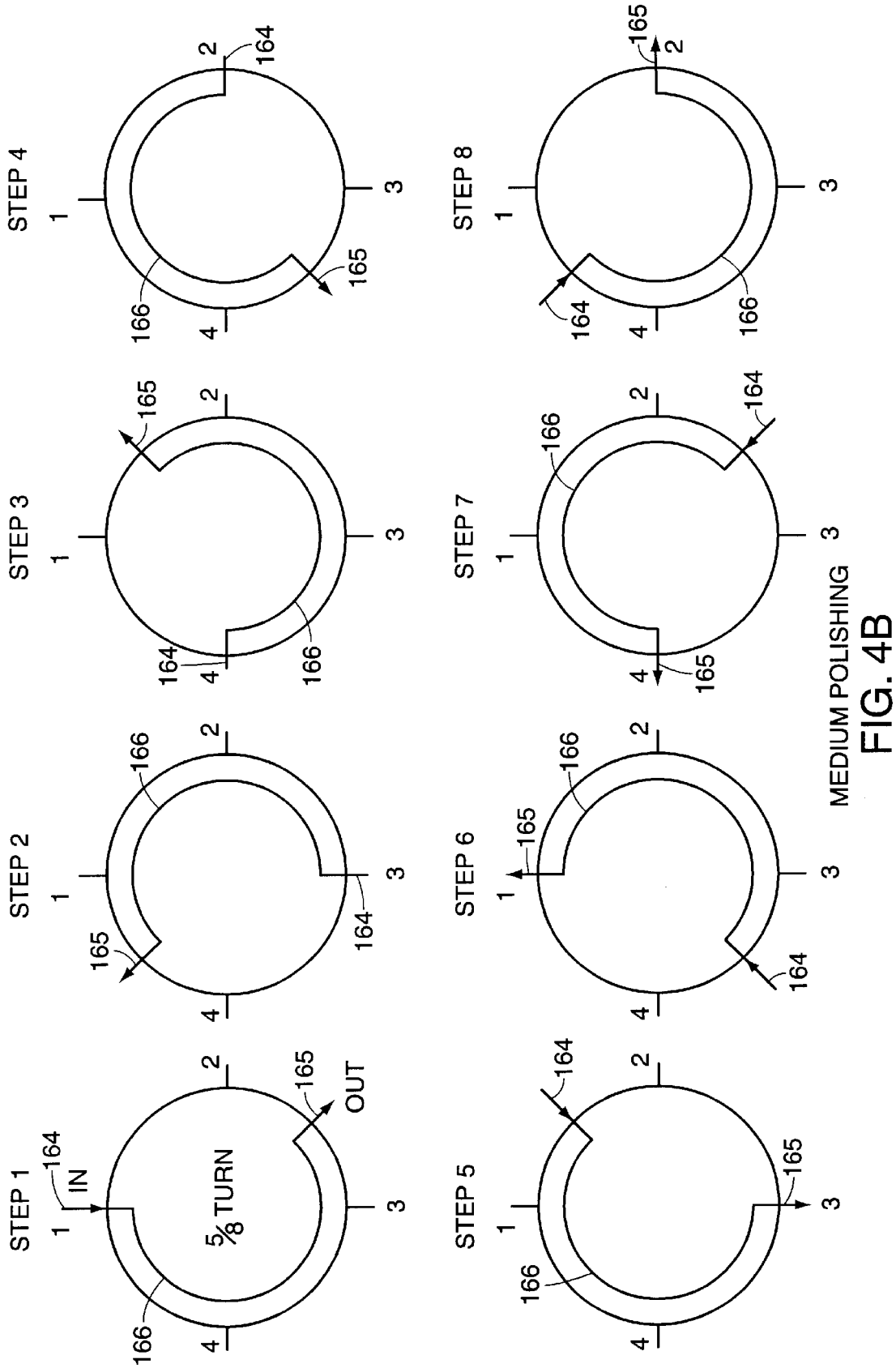
FIG. 4B MEDIUM POLISHING

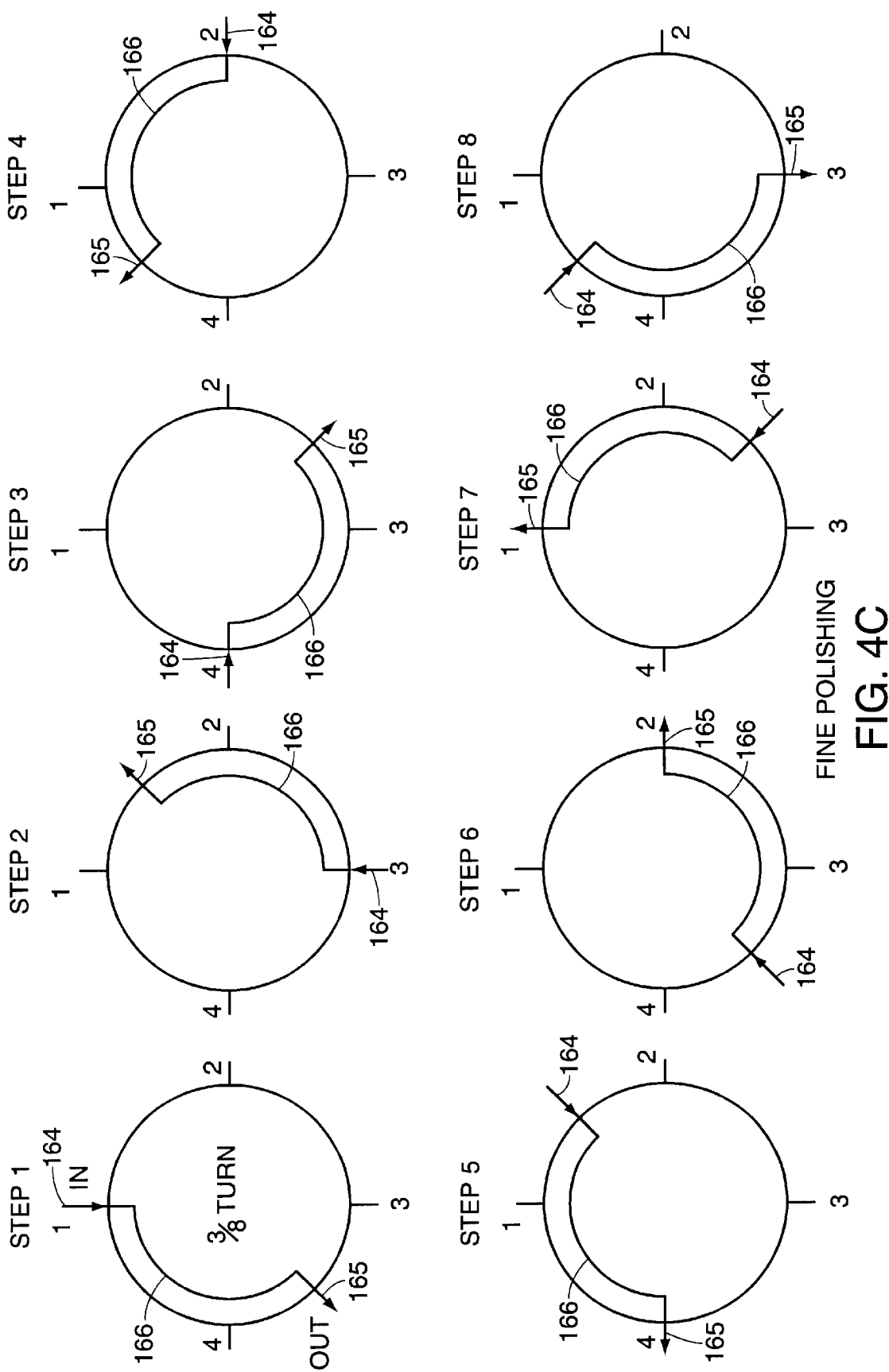
FIG. 4C FINE POLISHING

FIRST COARSE POLISH

SECOND COARSE POLISH

100μm

10μm

POLISHED FUSED OPTICAL FIBER ENDFACE

RELATED APPLICATIONS

This application is a is a continuation-in-part of U.S. application Ser. No. 08/965,798, filed Nov. 7, 1997, now U.S. Pat. No. 6,137,938, the entire teachings of which are incorporated herein by this reference, which claims priority to U.S. Provisional Application No. 60/048,573, filed Jun. 4, 1997, the entire teachings of which are also incorporated herein by this reference

BACKGROUND OF THE INVENTION

In optical-fiber light-transmission systems, it is typically important to increase the coupling efficiency between some type of opto-electronic device, such as a light source or detector, and the optical fiber transmission media. One of the most common applications is in communications systems, in which an optical signal, generated by a modulated semiconductor diode, laser diode light source, or a source with a separate modulator, is coupled into a fiber. For long distance transmission applications, the laser diode is usually a single-transverse-mode device, and the fiber only propagates a single mode. At the distant end of the fiber and typically after multiple hops through fiber amplifiers, the optical signal is coupled from the end of the fiber to a detector, where it is converted back to an electrical signal. There are also ancillary applications such as the laser diodes that are used to optically pump the fiber amplifiers. Here, the pump light generated by the laser diode is coupled into a fiber for transmission to the fiber amplifier.

The coupling issues typically surround the interface between the opto-electronic device and the end of a fiber in an opto-electronic module. In the most common implementation, the opto-electronic device, laser diode or detector, is affixed to a substrate, which is installed in the opto-electronic module. The end of a short length of specially sheathed optical fiber, termed the pigtail, is brought into the module, aligned to the opto-electronic device, and secured by reflow soldering, laser welding, or some other technique. Considering the example of modulated sources, such as directly modulated laser diodes or cw laser diodes with modulators, or pumps where the issues of high coupling efficiency are typically most important, there are a number of techniques for maximizing coupling efficiency. Selection between these techniques involves some tradeoffs between three different factors: module-manufacturing complexity, yield, and coupling efficiency.

The simplest coupling approach is optical fiber pigtail cleaving, with butt coupling. The end of the optical fiber is cleaved to a vertical, clean, flat endface. This endface is then secured in the opto-electronic module as close as possible to the light-emitting facet of the opto-electronic device.

Butt coupling has good yield since vertical endface cleaving is easily reproducible. The technique is also the least expensive, again because cleaving is a relatively easy technique. It suffers, however, from poor coupling efficiency. Typically, only about 10% of the light emitted from the opto-electronic source is coupled to be transmitted through the fiber.

In order to increase coupling efficiency over butt coupling, the general technique is to place a convex lens at the end of the fiber pigtail so that more light is collected from the opto-electronic source into the fiber's core. One of the simplest techniques is to secure a micro-spherical bead to the end of the fiber to function as a lens. Specifically, the end of the fiber is etched to have a concave surface, and then the micro-spherical bead is glued to the fiber's end. This has advantages in manufacturability and substantially higher coupling efficiencies, approaching 40%.

When still higher coupling efficiencies are required, microlens endfaces are fashioned on the optical fiber pigtail. There are three common techniques for achieving this: pulling, etching, and polishing. Each of these techniques allows for the formation of a fiber endface on the pigtail that closely matches the hyperbolic surface, which is ideal for coupling efficiency, but the techniques offer varying levels of reproducibility.

Fiber pulling involves drawing the fiber in a flame to create a necked-down region and then cleaving the fiber at this narrowed waist, possibly followed with flame fusing. This technique is simple, but the resulting lens has large deviations from a hyperbolic surface.

In the past, many standard laser source's fiber endfaces where made by etching and then fusing hemispheric lenses. The coupling efficiencies ranged from 50 to 75%. Specifically, the fiber was polished with its jacket in place and then soaked in a heated, buffered hydrofluoric acid solution for 3–4 hours. This was performed until the target end diameter of approximately 13 $\mu$m, +/−3 $\mu$m was produced. An electrode arc was then used to melt and finish the lens. The problem here, however, was concentricity of the lens relative to the fiber's core, and this process was very dependant upon the fiber jacketing and characteristics of the particular fiber etchant.

Finally, fiber polishing involves using a motor-controlled jig to bring the end of the optical fiber pigtail in contact with a rotating abrasive wheel and polishing the endface to form the intended endface lens. Here, in the past, the lenses have typically been formed with typically steep or obtuse vertex angles.

SUMMARY OF THE INVENTION

If high coupling efficiencies are required, lens polishing or etching techniques are among the few options that are available. Fiber pulling techniques yield a lens that deviates too strongly from the optimal hyperbolic endface. Of the two remaining techniques, fiber endface etching is the easiest to perform. The major problem, however, arises in yield. Typically, etch rates for fiber pigtails vary from batch-to-batch. As a result, typically test etching must be performed to determine the optimal solution concentrations and etch times. Further, even when these factors are optimized, the etched lens may not be concentric with respect to the optical fiber pigtail's core, which substantially impairs coupling efficiency to render the nonconcentric fibers useless.

This leaves endface polishing as the remaining choice. There are a number of problems, however, with existing techniques. Typical fiber polishing techniques yield a very conical endface surface which deviates from the optimal hyperbolic surface. Further, research has shown that the common obtuse vertex angles are sub-optimal for coupling efficiency.

The present invention involves a number of innovations in optical fiber endface polishing that substantially increase coupling efficiency while simultaneously improving yield. Specifically, the endface of the fiber is polished, preferably to form a frustum-like or pointed endface. However, after polishing, it is fused, preferably in an arc fuser to form a smooth, rounded endface. Research has additionally shown that the vertex angles used in most polishing techniques are too large. In this way, older fiber drawing techniques offered certain advantages. As a result, according to the invention, the endface of the fiber is polished to have an acute vertex angle, resulting in substantial improvements in coupling efficiency.

In general, according to one aspect, the invention features an endface of an optical fiber. The endface has a frustum region, which is produced by polishing the endface. In order to produce the optimal rounded and smooth tip, however, the polished fiber is then fused.

In specific embodiments, the polished frustum region is frusto-conical, or near conical. Such circular symmetry is desirable where the opto-electronic source has high far field symmetry as in the case with most modulated opto-electronic sources.

Preferably, to increase coupling efficiency, the vertex angle of the polished frustum region is acute, preferably between 16° and 20°. Research has shown this to be the optimum range. Further, match the desired hyperbolic surface, an intermediate frustum region is preferably polished into the fiber.

In general, according to another aspect, the invention concerns an opto-electronic module. This module contains an opto-electronic device, such as a laser diode or laser diode/modulator, or even an opto-electronic detector. An optical fiber in the form of a pigtail transmits the optical signal either from or to the opto-electronic device. This pigtail, according to the invention, has an endface that has a polished frustum region and a fused tip.

In general, according to another aspect, the invention also features a method for manufacturing a lens at the end of an optical fiber. The method comprises polishing the end while rotating the optical fiber around its axis. Then, according to the invention, the tip of the fiber is fused.

In specific embodiments, the concentricity of the fiber is checked during the polishing step. Research has shown that the concentricity must be controlled in order to maximize the coupling efficiency. The lack of this control was one of the primary drawbacks associated with the fiber endface etching techniques.

In the preferred embodiment, an endface with two or more discrete vertex angles is produced by polishing as the endface is placed in contact with a polishing wheel.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the drawings, like reference characters refer to the same parts throughout the different views. The drawings are not necessarily to scale, emphasis instead being placed upon illustrating the principles of the invention. Of the drawings:

FIG. 4B is schematic cross-sectional view of an optical fiber illustrating a medium polishing according to the present invention;

FIG. 4C is schematic cross-sectional views of an optical fiber illustrating a fine polishing according to the present invention;

DETAILED DESCRIPTION OF THE INVENTION

Figure 1:
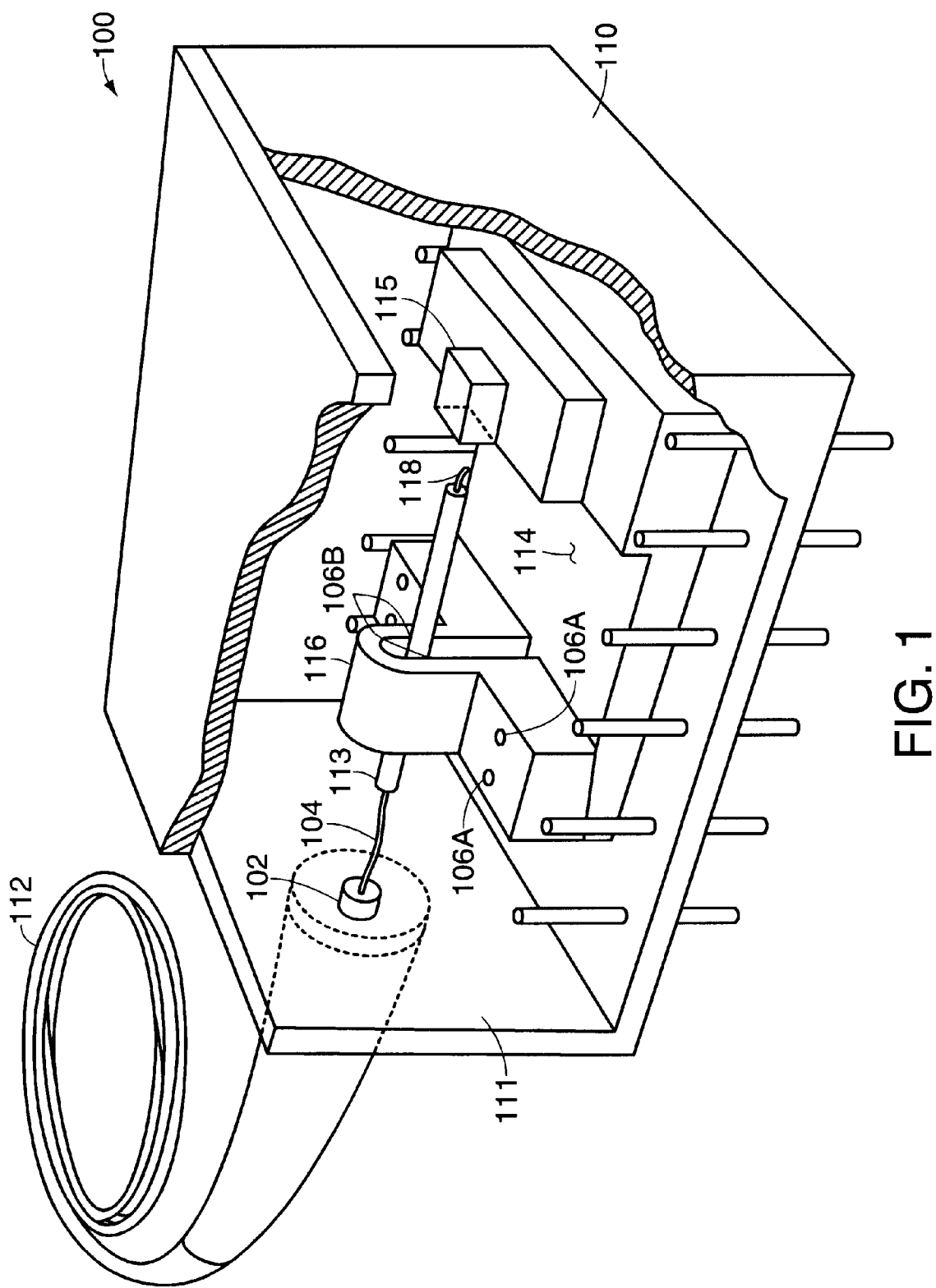
FIG. 1 is a perspective, partial cutaway view of an opto-electronic module, illustrating an application of the present invention.

FIG. 1 shows an opto-electronic module 100 in which the inventive optical fiber is installed. The module 100 comprises a box-like package 110. A booted optical fiber pigtail 112 extends through a distal wall 111 of the package 110 and is secured and terminated to a usually thin-film substrate 114. In the illustrated implementation, the plastic jacket 102 is removed from the glass-silica fiber 104, which is then metalized. The metalized fiber is soldered to an adjustment tube 113. A bracket or clip 116 is used to secure the tube 113, and thus the optical fiber center 104 to the substrate 114. This bracket 116 can be welded, soldered, or otherwise secured to the substrate using known techniques, such that the optical fiber 104 is held by the bracket 116 on the substrate 114, with its endface 118 in proximity to and in a predetermined relationship with an opto-electronic device 115. The illustrated embodiment has four laser-weld points 106A that secure the bracket 116 to the substrate 114 and weld points 106B that secure the tube 113 to the bracket 116. As mentioned previously, the opto-electronic device 115 is typically a diode, laser diode, LED, or laser-modulator system, but can also be a detector. The alignment is typically crucial requiring accuracies and life-time stabilities on the order of 0.2–0.6 micrometers ($\mu$m).

Figure 2:
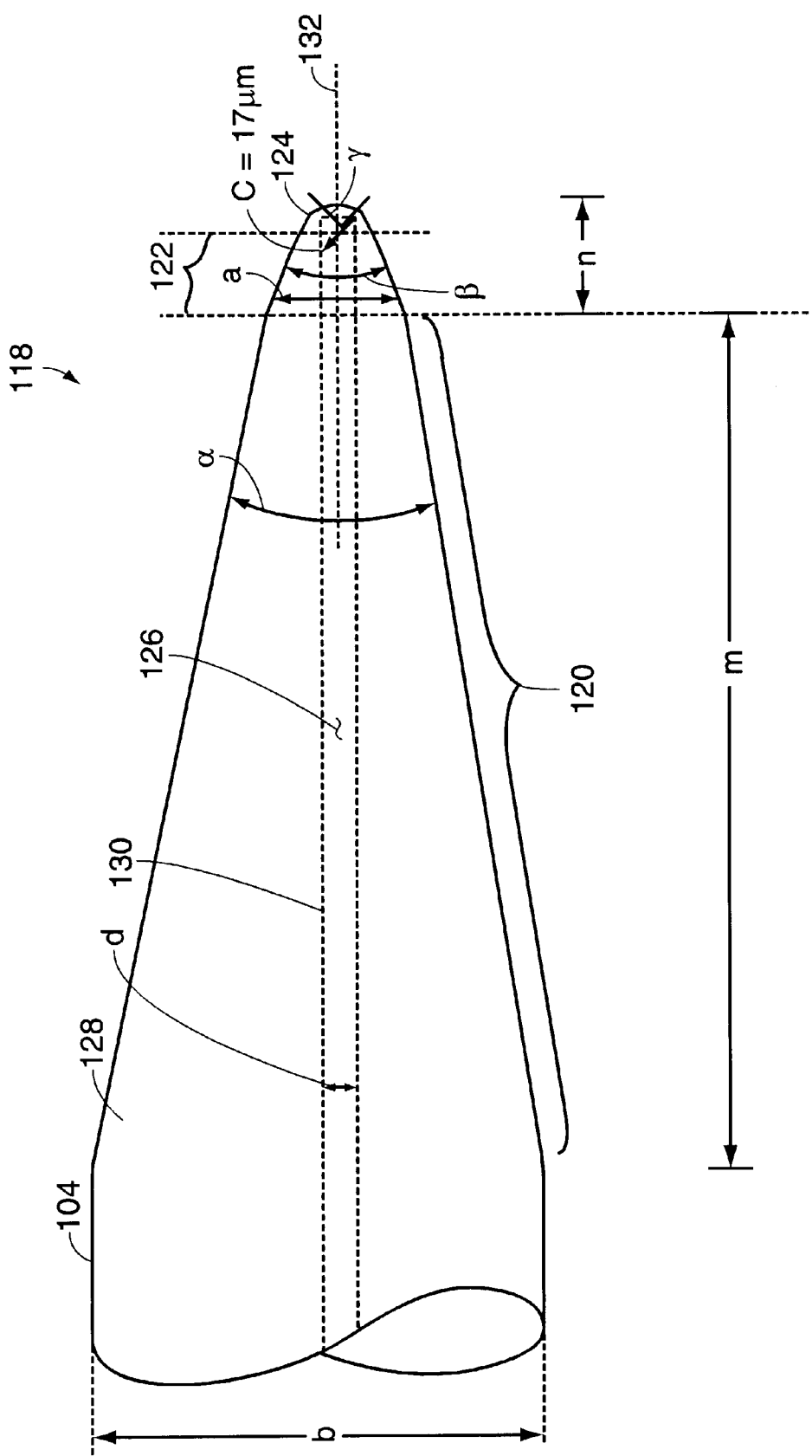
FIG. 2 is a scale, side plan view of an endface of an optical fiber according to the present invention, 1 inch=50 micrometers.

FIG. 2 is a scale, side view of an optical fiber endface 118, which has been constructed according to the principles of the present invention. Generally, as is common, the optical fiber 104 is comprised of a core region 126, in which most of the optical power is transmitted and a cladding region 128 that confines the optical signal to and in a region surrounding the core. A cladding/core boundary or interface 130 separates these two concentric regions of the optical fiber 104. The index profile is usually a step, as is common in single mode fibers.

In order to increase the coupling efficiency between the light propagated in the fiber 104 and the opto-electronic device 115, shown in FIG. 1, a lens is formed at the optical fiber endface 118.

The endface 118 comprises a polished frustum region 120. This frustum region 120 is formed on the endface of the fiber by polishing and is created to be as concentric as possible with respect to the center axis 132 of the fiber 104. In preferred embodiment, the frustum region is conical or near conically shaped, i.e., circularly symmetric. Thus, the aspect ratio of the cross-section of the polished frustum region is preferably between 1.5:1 to 1:1. However, in alternative implementations, an elliptical frustum region is implemented in the case of elliptical core fibers and/or where there is low the far-field circular symmetry in the source 115.

For a fiber that is b=125 micrometers ($\mu$m) in diameter, the length of the polished frustum region is about m=300 $\mu$m, preferably 270 $\mu$m.

In the preferred embodiment, the surface of the polished frustum region 120 does not extend into or invade the core 126 of the fiber. Specifically, the polished frustum region 120 is polished into the fiber endface 118 such that the top frustum diameter "a" is equal to approximately three-four times the diameter "d" of the core 126. In the preferred embodiment, the core is approximately d=8 $\mu$m with a mode field diameter of about 10 $\mu$m.

A fused frustum region 122 extends from the polished frustum region 120 towards the tip 124 of the endface 118. Preferably, the fused frustum region is formed by a combination of polishing followed by the fusing of the fiber. The length of the intermediate frustum region is about n =25–35 $\mu$m, usually 30 $\mu$m.

The tip 124 of the endface is smooth spherical lens due to the glass's-surface tension during fusing. The tip is fused such that it has a best fit to a c=17 $\mu$m diameter circle. The spherical sector of the tip is $\gamma$=80 to 120°.

In the preferred embodiment, the fiber endface 118 has a very low angle. Specifically, the vertex angle $\alpha$ of the polished is less than 25°, between 16° and 20°. Preferably, it is about 16°. The fused frustum region 122 has a somewhat larger vertex angle in the preferred embodiment. Specifically, it is less than 90°, and preferably less than 60°; in the illustrated embodiment, it is between 44° and 50°. The tip 124 is then fused to generate a rounded lens tip. As a result, the overall cross-section profile of the fiber endface 122 closely matches the ideal hyperbolic cross-section.

Figure 3A:
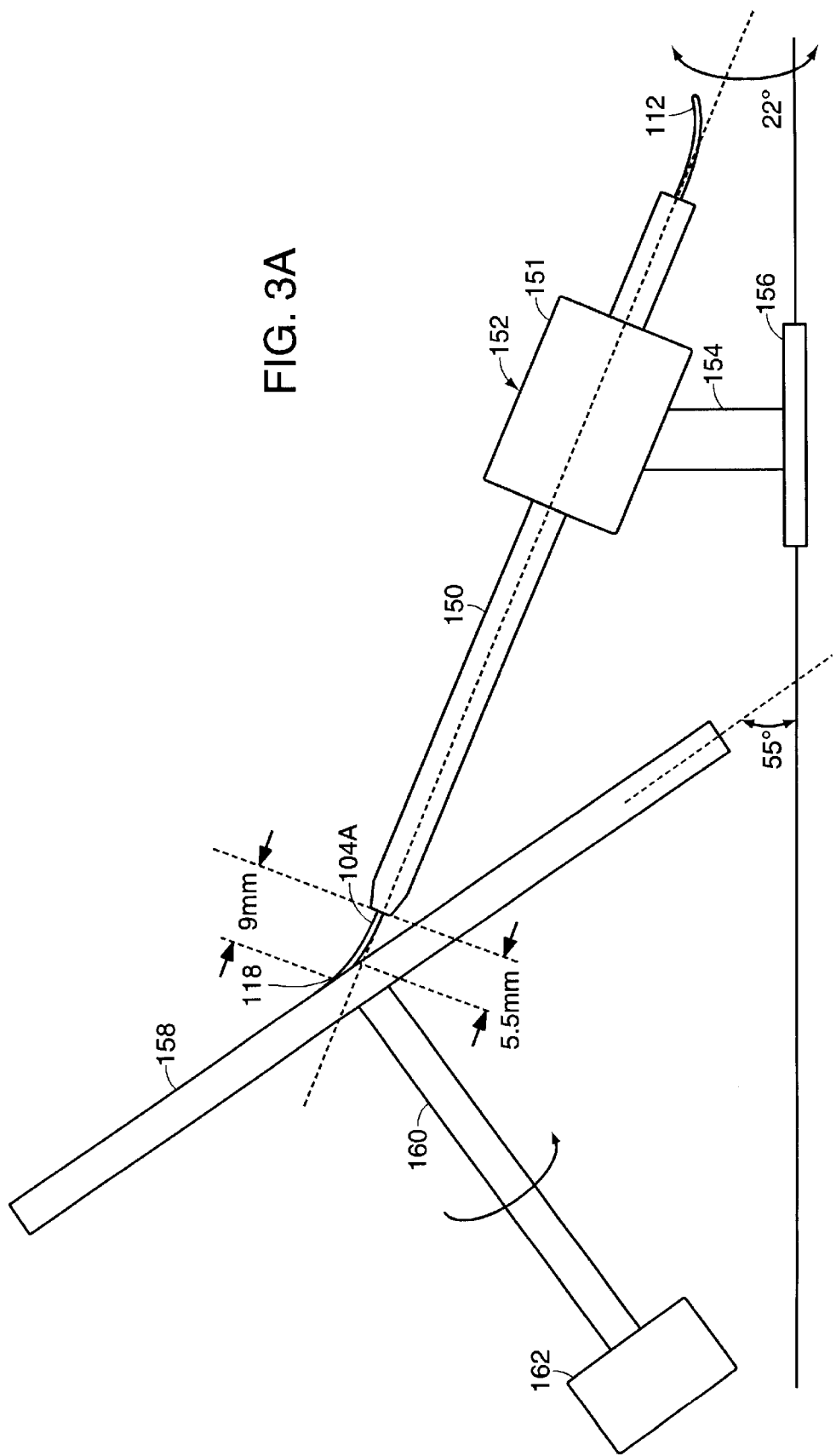
FIGS. 3A and 3B are schematic side and perspective views of an optical fiber polishing apparatus or jig according to the present invention.
Figure 3B:
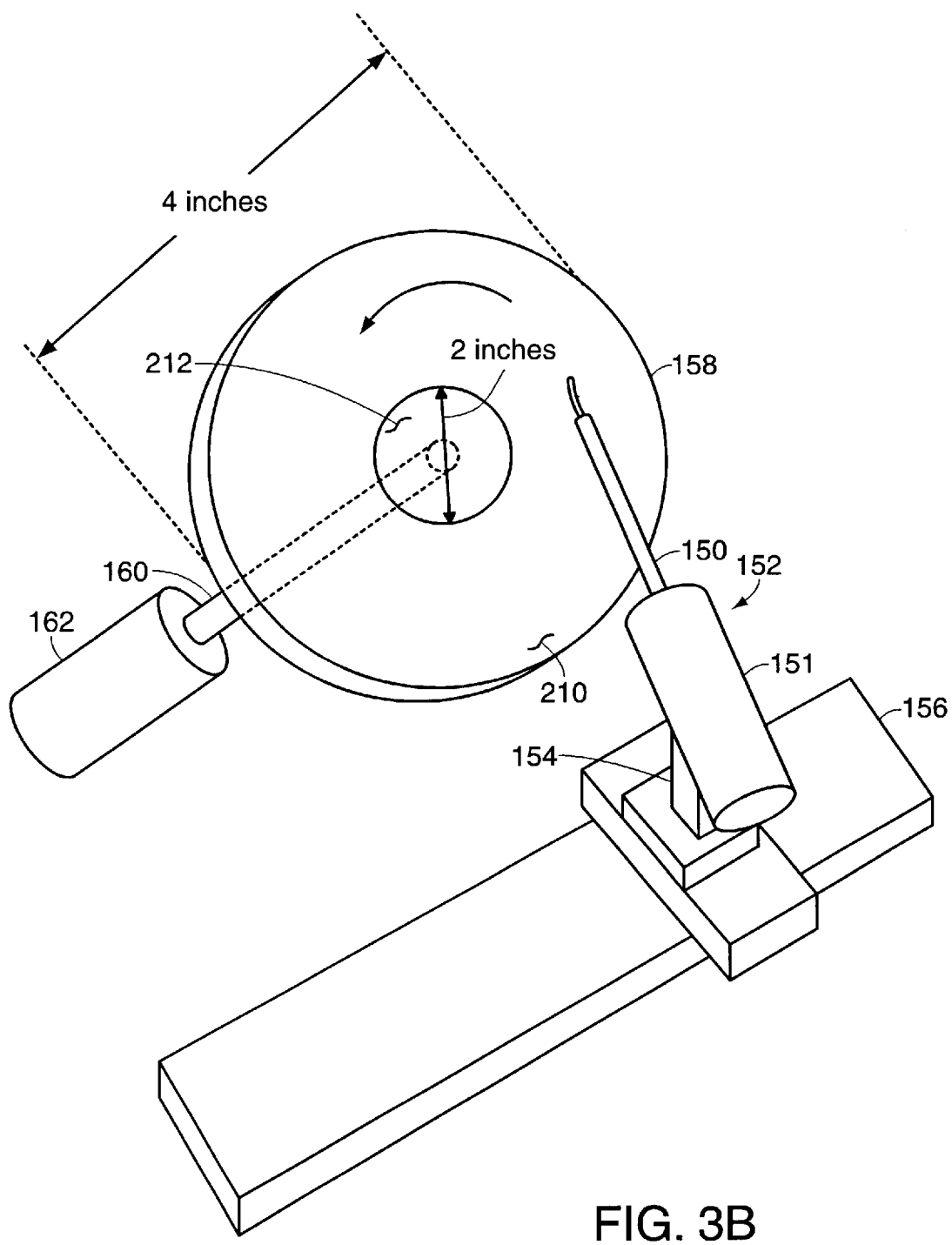

FIGS. 3A and 3B show the polishing device for forming a fiber endface as illustrated in FIG. 2. As shown in the side view of FIG. 3A, the fiber polishing device comprises a fiber rotating jig device 152. Specifically, the jig device has a rigid barrel 150 through which the fiber pigtail extends 112. The barrel holds the fiber by its plastic jacket. This barrel is driven to rotate by a motor in the housing 151 to turn or rotate the fiber axially. Further, the jig device 152 is supported on an arm 154 that rides in a track 156 so that the fiber 112 can be moved in and out of contact with polishing wheel 158.

The fiber endface 118 is polished by driving the polishing wheel 158. Specifically, the wheel is connected to a shaft 160, which is turned by a motor 162. In a preferred embodiment, the wheel face 158 is angled at 55° with respect to horizontal. The rigid barrel 150 is at 22° with respect to horizontal. As a result, the angle between the polishing wheel 158 and the rigid barrel 150 is a relatively obtuse 147°. As illustrated by the figure, however, the polishing angle is actually larger. The distance between the end of the barrel 150 and the closest point on the polishing wheel is 5.5 millimeters (mm). 9 mm of the pigtail 112, however, extends from the end of the barrel 150. This 9 mm of the pigtail 112 is unjacketed, ie., only glass silica fiber 104. As a result, the fiber 104 bends upward, in the direction of wheel rotation so that there is a low angle between the end of the fiber and the wheel 158; the resiliency of the glass silica fiber 104 controls the polishing force.

The cleaving the fiber for polishing at a distance 165% of the distance from the fiber holder to the wheel results in shallow angles relative to the fiber transmission axis for out side radial position and steeper angles for polished surfaces closer to the fiber center. This difference between cleaved fiber and distance to wheel also compensates for any angular misalignment of the fiber in barrel 150. Further, the contact pressure between the endface and polishing wheel is dictated by fiber resiliency, and does not need to be actively controlled. Also, the length can be changed to modify and control polish angle.

FIG. 3B further illustrates the fiber polishing apparatus. As shown, the fiber endface 118 of the pigtail 120 contacts the polishing wheel 158 at a midpoint between its center and rim. The face of the polishing wheel preferably has two paper grits. The coarser grit 210 around the periphery and a finer grit 212 concentrically in the center of the wheel 158.

Figure 4A:
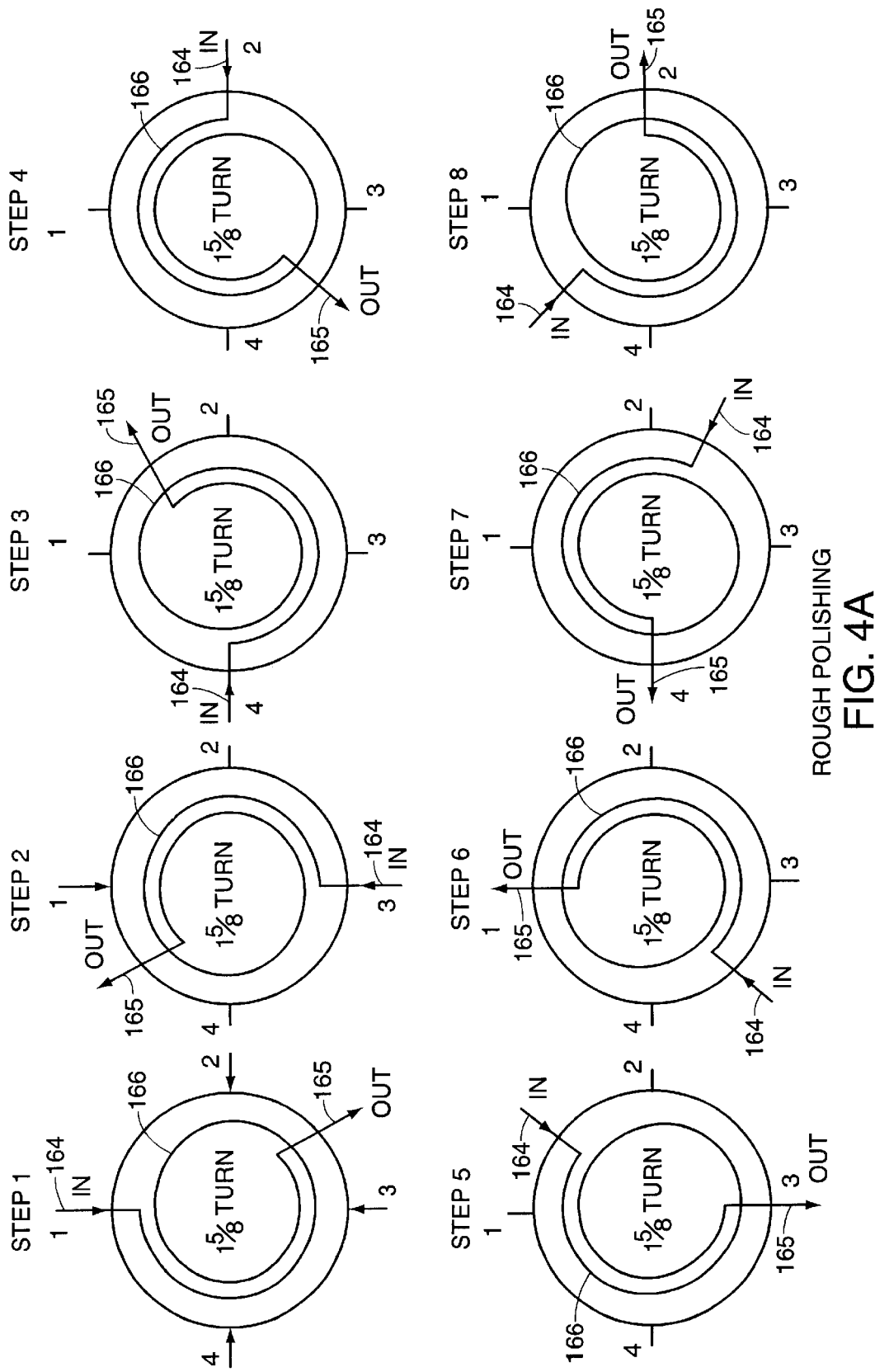
FIG. 4A is schematic cross-sectional view of an optical fiber illustrating a coarse polishing according to the present invention.

FIGS. 4A and 4B illustrate the polishing process according to the present invention, after the fiber is first cleaved and loaded into the fiber polishing jig 152.

FIG. 4A illustrates the first stage of the coarse polishing sequence, which is performed on a coarser grit polishing paper of 9 $\mu$m. Specifically, for a given fiber endface 118, four positions (1, 2, 3, 4) are defined spaced at equal distances around its diameter. In the first step in the coarse polishing, position 1 is brought in contact with the polishing wheel, as illustrated by arrow 164. While in contact with the wheel, the fiber is rotated 1⅝ turns as illustrated by arrow 166. Thereafter, the fiber is withdrawn from the wheel as illustrated by arrow 165. In the next step in polishing, the fiber is rotated so that position 3 is first contacted with the polishing wheel (164) and again the fiber is rotated 1 and ⅝ turns starting at position 3 while in contact with the wheel (166). Then, in the third polishing step, the fiber is rotated so that position 4 will contact the wheel and the fiber is brought in contact with the rotating wheel. The fiber is again rotated 1⅝ of a turn. Finally, the fiber is rotated such that position 2 will contact the wheel by the polishing jig's barrel. Thus, position 2 first contacts the wheel, and again, the fiber is rotated 1 and ⅝ turns while being polished.

The coarse polish further contains steps 5–8 where the fiber is again rotated 1⅝ turns as shown in FIG. 4A. The polishing is started at positions 1.5, 3.5, 2.5, and 4.5, respectively, and indicated by arrows 164, rotated through arcs as indicated by arrows 166, and then withdrawn from the wheel as indicated by arrows 165.

Figure 5A:
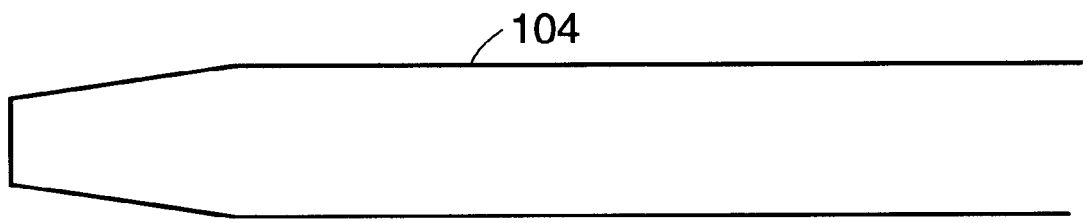
FIGS. 5A and 5B are images of a fiber endface after a two coarse polishings.

FIG. 5A shows a typical fiber endface after the first coarse polishing. There is still a substantial portion of the original cleaved endface remaining. If the diameter of the endface is greater than 14.5 $\mu$m, the coarse polishing is repeated until the endface is smaller than the 14.5 $\mu$m diameter.

Figure 5B:
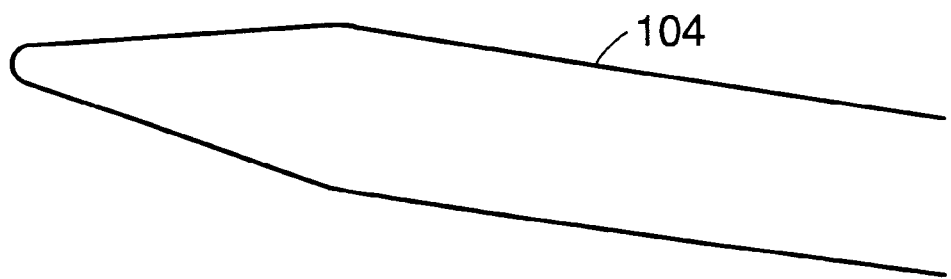

FIG. 5B shows a typical fiber endface after the second coarse polishing. Again, there is still a substantial, albeit smaller, portion of the original cleaved endface remaining. If the diameter of the endface is between 14.5 $\mu$m and 7 $\mu$m in diameter, a medium polish is performed. If the cleaved endface is less than 7 $\mu$m to non-existent, the fine polish is performed.

FIG. 4B shows the medium polish process which is also perform on the 9 $\mu$m grit polishing paper. The initial points of contact, see arrows 164, for steps 1–8 are the same as the coarse polish, but the fiber is only rotated ⅝ of a turn, see arrows 166, before being withdrawn, see arrows 165.

FIG. 4C shows the fine polish process, which is also performed on the 9 µm grit polishing paper. The initial points of contact, see arrows 164, for steps 1–8 are the same as the coarse polish, but the fiber is only rotated ⅜ of a turn, see arrows 166, before withdrawal from the wheel 158, see arrows 165.

The medium and fine polish processes are performed until all of the cleaved endface is removed, i e., the endface 118 has been over-polished.

Critical to the coarse, medium, and fine polishing on the 9 µm grit polishing paper is the fact that the frustum region 120 is concentric with respect to the core 126 and fiber axis 132. In the preferred embodiment, this concentricity is confirmed for every stage of the polishing in order to ensure that it is being maintained. The concentricity is checked by illuminating the non-polished, distant end of the pigtail and viewing the polished endface. The coarse polishing can then modified to re-establish concentricity as required using an adaptive technique.

Finally, in the preferred embodiment, a finish polish is performed on a fine grit paper 212 located on the same wheel as the coarse grit paper. This finish polish is the same as the coarse polish (eight steps with 1⅝ turns per step) illustrated in FIG. 4A, except for the use of a finer 3 µm grit polishing surface.

Figure 6:
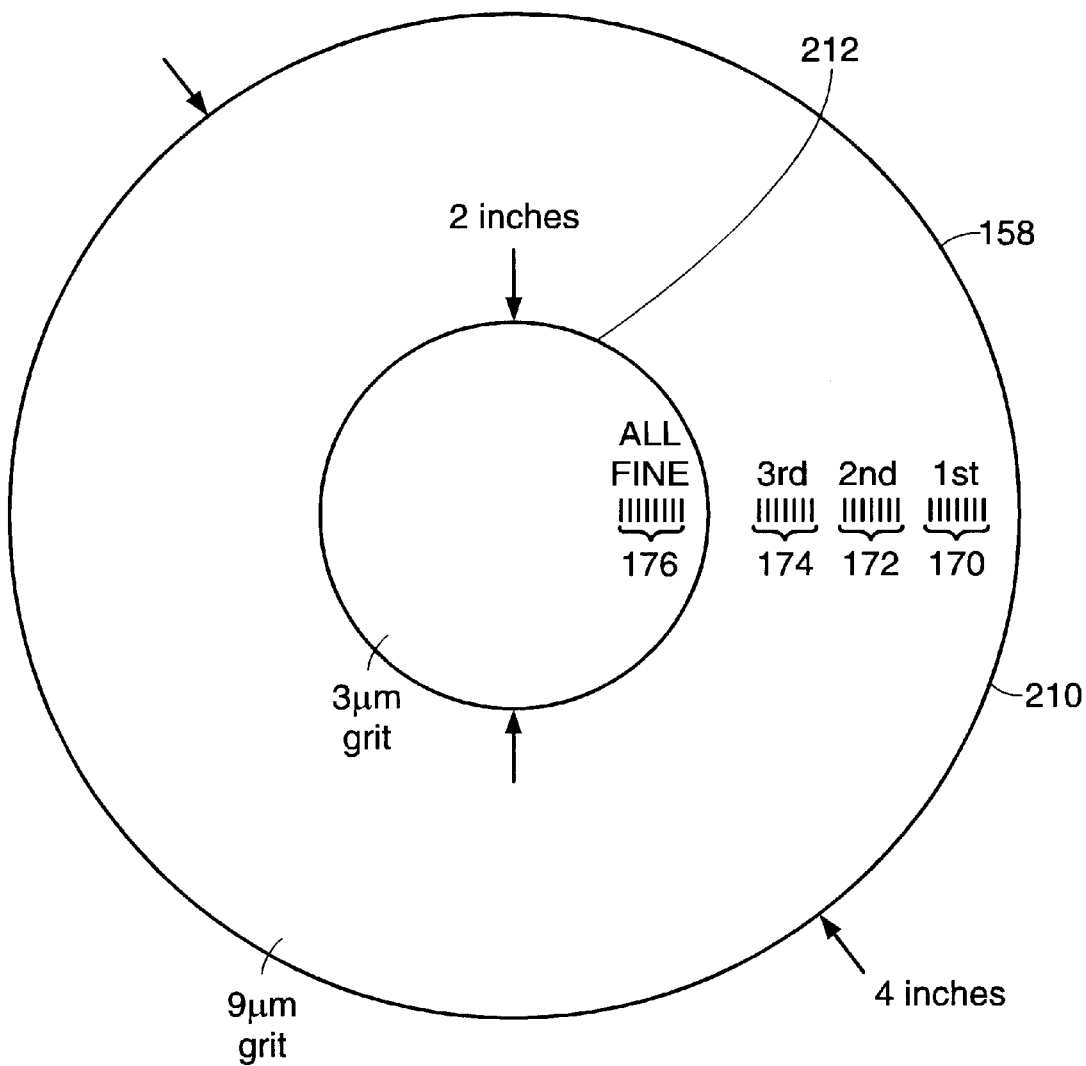
FIG. 6 is a top plan view showing polishing regions on the polishing wheel.

FIG. 6 illustrates where the polishing steps are performed in the polishing wheel 158. Region 170 shows the eight slots in which coarse grit polishing of a first fiber endface is performed. The eight slots correspond to the eight steps of the coarse, medium and fine polishing processes that take place on the coarse, 9 µm grit paper. As a result, the eight slots are reused for every successive coarse grit polishing of the same fiber. A second fiber is then polished on region 172, and so on working radially inward to at least a third region 174.

The polishing wheel 158 comprises a 2 inch disk (3 um grit) 212 on top of 4 inch disk (9 um) 210. Having grits on same wheel ensures the distance from polishing wheel to fiber holder is exactly the same for both grits. It appears that radial position effects the concentricity of the polishing lens. Center radial polishing gives more concentric polishing. By having the 3 um paper in center control is provided and the most concentric polishing. Further, wetting of polishing wheel during processing increases the consistency of fiber-to-fiber polishing. Thus, the wheel is wet at the beginning of each polishing segment. Rotational speed of the barrel 150 of the jig 152 while the fiber is in contact with the wheel is 12 to 5 rpm. 40 axial rotations of the fiber are performed for the typical process. This has the advantage of reducing fiber axial twist. In fact twist can be undone between each step by controlling rotation direction. The polishing wheel is drive at between 50 and 200 rpms, preferably 75 rpms.

These radial movements of the fiber between polishing slots occurs while the fiber is not in contact with the wheel. A ring or region of new or unused paper is consumed for each polishing segment on the coarse paper. This produces consistent and predictable polishing for each segment. The use of concentric rings also conserves paper allowing 3 fibers to be polished on one 4 inch/2 inch sheet.

The finish polish is performed on a fine grit paper 212 located on the same wheel as the coarse grit paper. Thus the fiber does not need to be transferred to a new jig. The eight steps of the finish polish are performed in the eight slots 176. Every fiber is polished in the same fine grit slots 176. 3 um paper has more control over the concentricity of the endface. The 3 um paper also leaves side of lens with smoother finish.

Figure 7A:
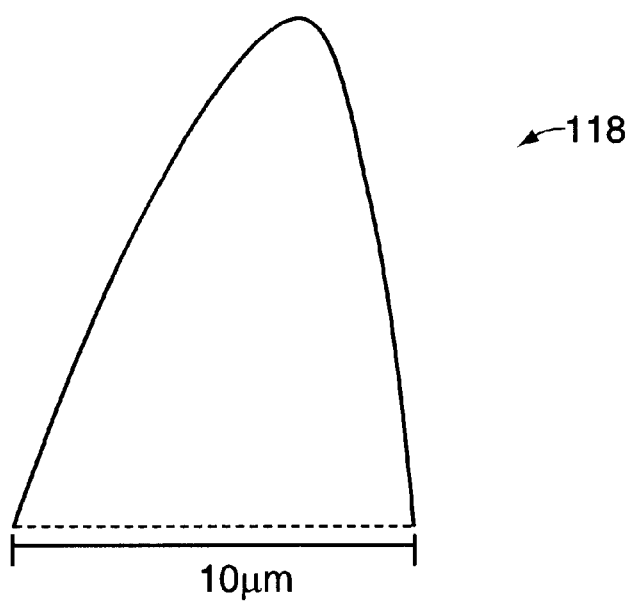
FIGS. 7A, and 7B, are images of the fiber endface after the finish polish at 500× magnification.
Figure 7B:
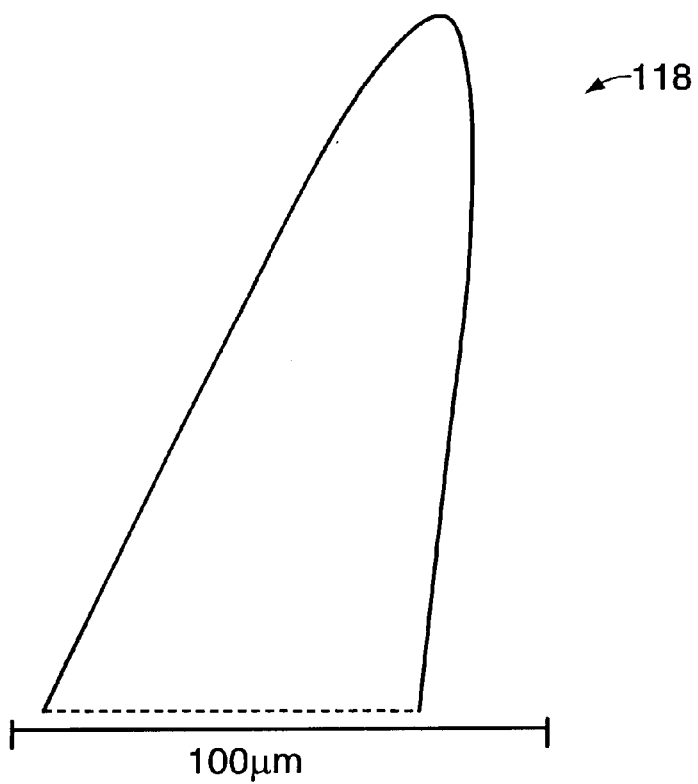

FIGS. 7A and 7B show an endface after the finish polishing step.

Figure 8:
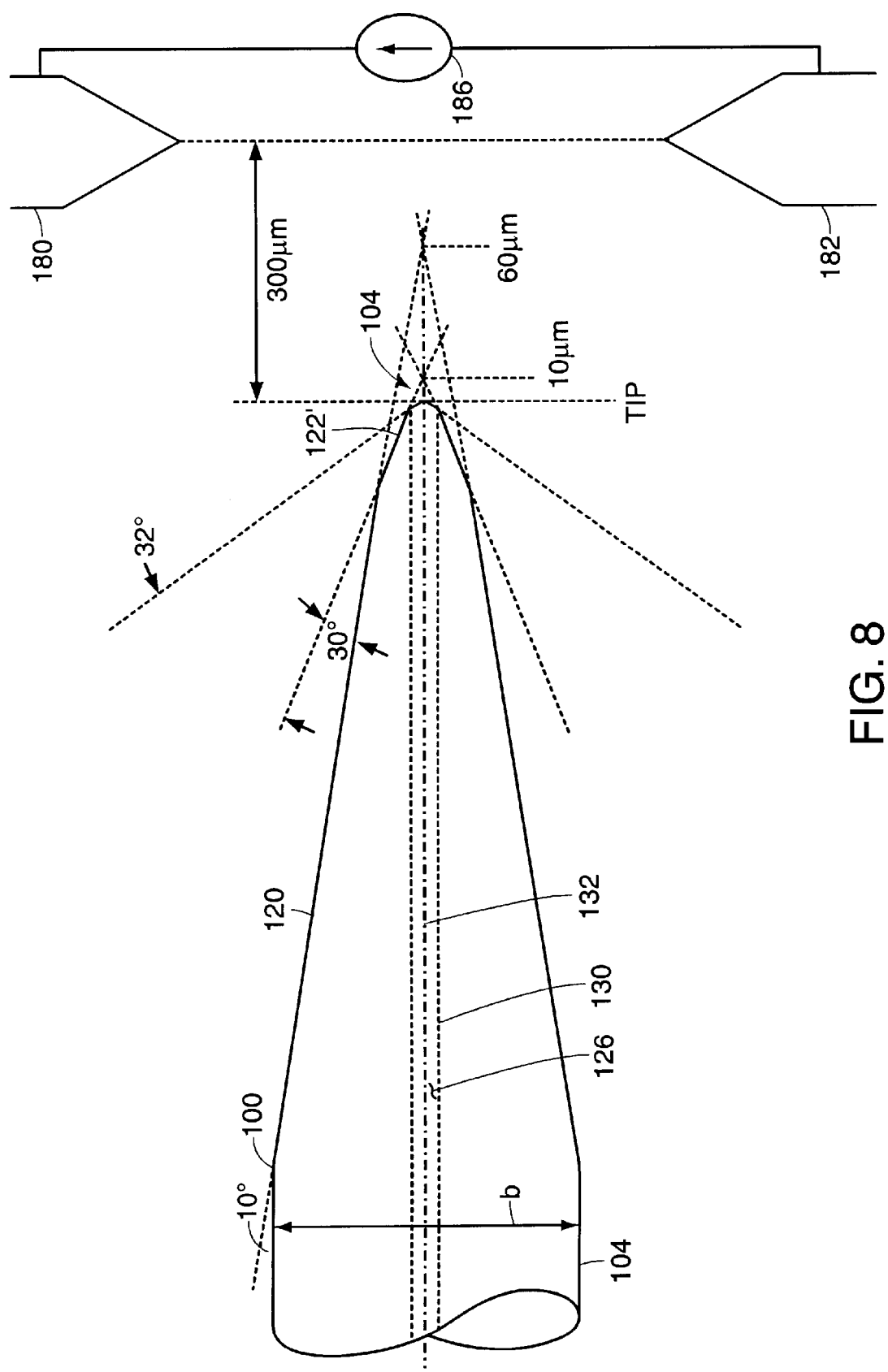
FIG. 8 is a side view of the endface in the arc fuser after polishing is complete, but before fusing.

FIG. 8 shows the endface 118 in an arc fuser after the finish polishing steps but before is started. The fiber comprises the polished frustum region 120, and intermediate polished frustum region 122' having a vertex angle of about 80 degrees, and a conical tip having a vertex angle about 142 degrees. The intermediate frustum region 122' and the conical tip are created by the initial contact with the wheel and at withdrawal from the wheel during polishing.

During fusing, an electric current travels between electrodes 180 and 182 from current source 186. The end of the fiber 104 is located x=300 µm from the line extending between the electrodes. This has the effect of heating the fiber tip to create its rounded end. Preferably, the endface is fused twice, with an axial rotation of 90–180 degrees between the first and second fusing. Surface tension of the melted glass forms a very systemic lens on polished end. This can compensate or repair slight imperfections in polished end.

After fusing, the fiber end is inspected. Fiber lens is positioned under 500× scope. with the transmission axis of the fiber pointed away from the microscope objective. By introducing white light to the through the other end of the fiber to operator can measure how concentric the lens sphere and the fiber transmission core is aligned.

Figure 9A:
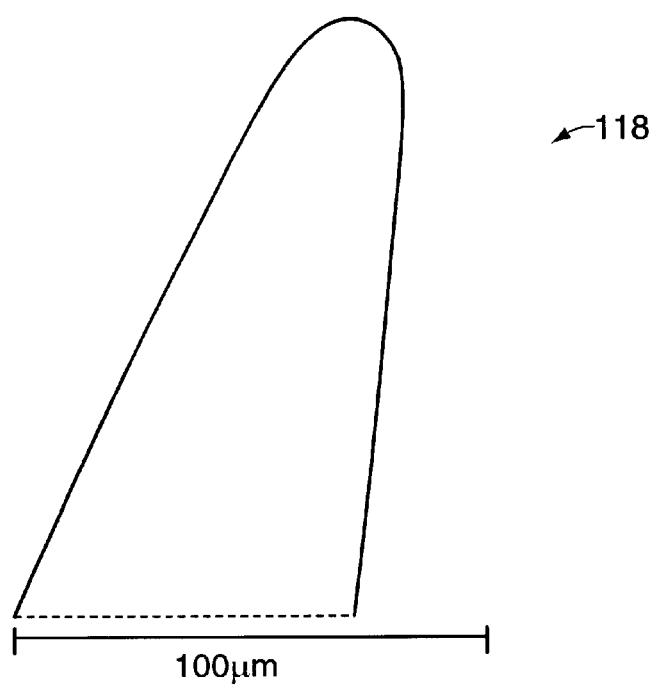
FIGS. 9A and 9B are images of the finished, fused endface at 500× and 1000× magnification.
Figure 9B:
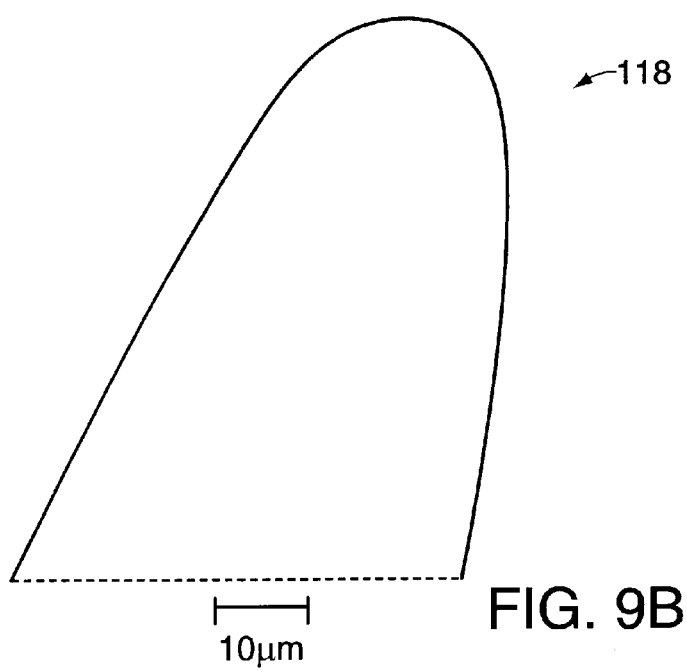

FIGS. 9A and 9B show the fiber tip after fusing and in its finished state.

Figure 10:
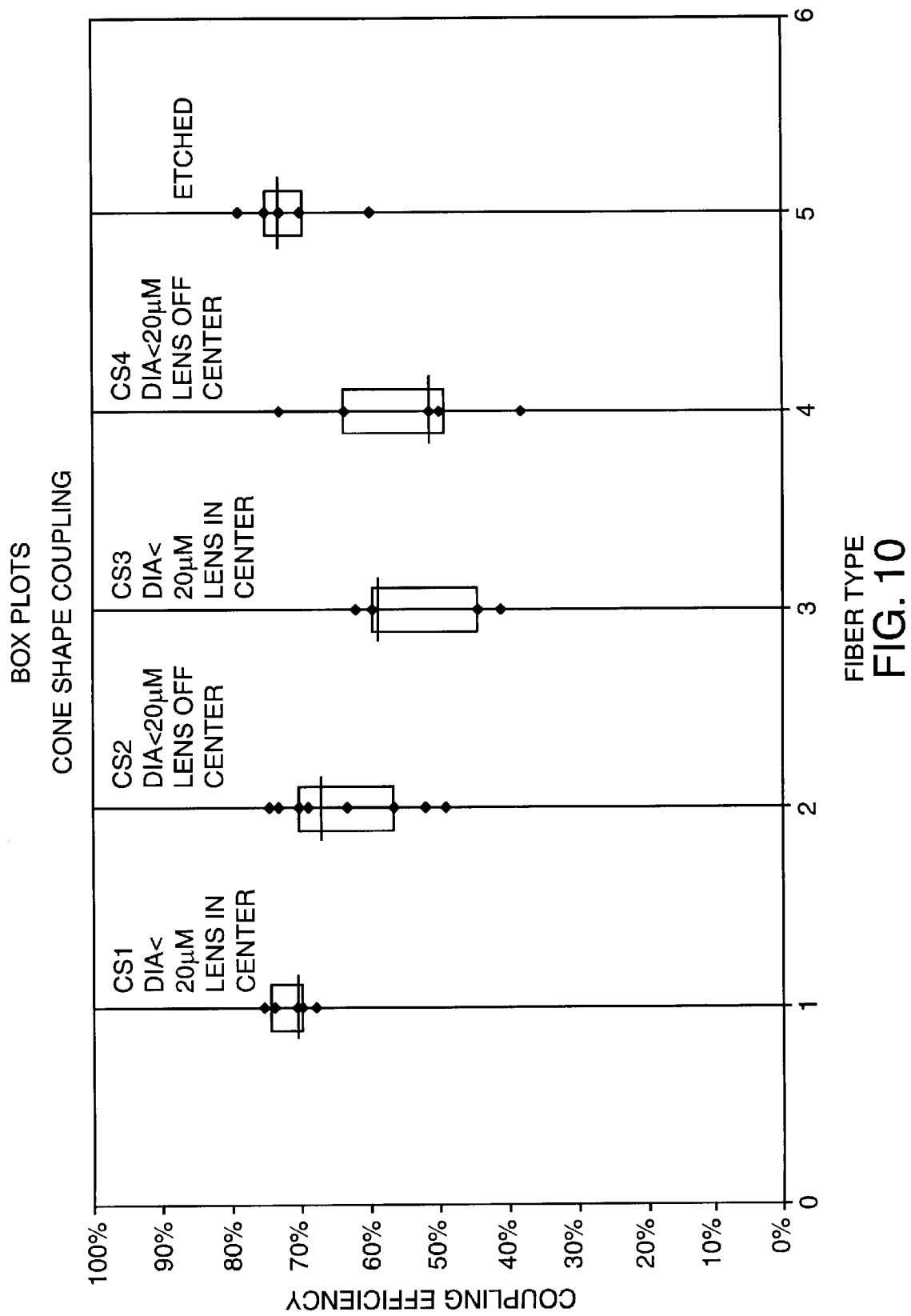
FIG. 10 is a graph of coupling efficiency as a function of fiber type illustrating the advantages of the inventive fiber lens manufacturing technique relative to other accepted techniques for lens manufacture.

FIG. 10 is a graph of coupling efficiency as a function of fiber type. As shown, using fiber types according to the present invention, fiber type #1, coupling efficiencies between 70 and 80% are achieved. As shown by fiber type #2, however, coupling efficiency falls to between 80 and 50% if the lens is formed off center or not concentrically with respect to the fiber center axis.

The achieved coupling efficiencies, tightly bound between 70 and 80% compare favorably with etched fibers as illustrated by fiber type #5, where, although the average coupling efficiency is slightly higher, there is a larger standard deviation in the result. Consequently, according to the present invention, higher yields can be achieved because of the lower standard deviation in coupling efficiency with better predictability in the quality of the finished module.

Average coupled power of fiber lenses made with this process are 74% of the light from typical ridge waveguide 1300 nm and 1550 nm laser chips. Coupled efficiency of as high as 79% have been found. The shape the coupling curves in X, Y and Z directions is similar to etched and fused fiber lenses.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A method for manufacturing a lens at an end of an optical fiber, the method comprising:
  polishing the end while rotating the optical fiber around its axis to form a taper, the rotating including multiple offset axial rotations of the fiber against a polishing medium, the multiple offset axial rotations comprising:
    contacting the end of the fiber with the polishing medium at a first axial position of the fiber;
    angularly rotating the fiber about its lengthwise axis a first number of turns to polish the end of the fiber;

withdrawing the end of the fiber from contact with the polishing medium;

contacting the end of the fiber with the polishing medium at an axial position of the fiber offset from the first axial position; and angularly rotating the end of the fiber about its lengthwise axis to polish the end of the fiber; and fusing a tip.

2. A method as in claim 1, wherein the step of polishing the end of the fiber comprises checking the polished regions of the end of the fiber for levels of concentricity.

3. A method as in claim 2, further comprising controlling subsequent polishing based upon the detected levels concentricity.

4. A method as in claim 2, further comprising controlling subsequent polishing based upon the detected levels circular concentricity to re-center the endface.

5. A method as in claim 1, wherein the step of polishing the end of the fiber comprises controlling the angle between the fiber and a polishing wheel such that a vertex angle of the fiber is between 16° and 50°.

6. A method as in claim 1, wherein the step of polishing the end of the fiber comprises forming a lower polished region and an upper polished region such that a vertex angle of the lower polished region is smaller than the upper polished region.

7. A method as claimed in claim 1, wherein a vertex angle of a lower polished region is between 16° and 20° and a vertex angle of an upper polished region is between 44° and 50°.

8. A method as in claim 1, wherein the step of polishing the end of the fiber comprises:

rough polishing in which the fiber tip is placed in contact with a polishing wheel while being rotated greater than 180° around its axis; and fine polishing in which the fiber tip is placed in contact with a polishing wheel while being rotated less than 180° around its axis.

9. A method as in claim 1, wherein the step of polishing the end of the fiber comprises:

rough polishing in which the fiber tip is placed in contact with a polishing wheel while being rotated around its axis to form a lower polished region; and a subsequent finish polishing in which the fiber tip is placed in contact with a polishing wheel while being rotated around its axis on a finer grit polishing surface.

10. A method as in claim 1, wherein the polishing medium is a rotating polishing wheel.

11. A method as in claim 10, wherein the polishing wheel has multiple grits supporting different grades of polishing.

12. A method as in claim 1 further comprising the steps of:

illuminating the non-polished end of the fiber; and viewing the polished endface to determine a lens shape at the fused tip.

13. A method for manufacturing a lens at an end of an optical fiber, the method comprising:

polishing the end while rotating the optical fiber around its axis to form at least two frustum regions; and then fusing a tip at the end of the optical fiber.

14. A method as claimed in claim 13, wherein the step of polishing the end of the fiber comprises checking the polished regions of the end of the fiber for levels of concentricity.

15. A method as claimed in claim 14 further comprising: controlling a subsequent polishing of the end of the fiber based upon the detected levels of concentricity.

16. A method as claimed in claim 14 further comprising:

controlling a subsequent polishing of the end of the fiber based upon the detected levels circular concentricity to re-center the endface.

17. A method as claimed in claim 13, wherein the step of polishing the end of the fiber comprises controlling the angle between the fiber and a polishing wheel such that a vertex angle of the fiber is between 16° and 50°.

18. A method as claimed in claim 13, wherein the step of polishing the end of the fiber comprises forming a first polished frustum region and a second polished frustum region such that a vertex angle of the first polished frustum region is smaller than the second polished frustum region.

19. A method as claimed in claim 18, wherein the vertex angle of the first polished frustum region is between 16° and 20° and the vertex angle of the second polished frustum region is between 44° and 50°.

20. A method as claimed in claim 13, wherein the step of polishing the end of the fiber comprises:

rough polishing in which the fiber tip is placed in contact with a polishing wheel while being rotated greater than 180° around its axis; and fine polishing in which the fiber tip is placed in contact with a polishing wheel while being rotated less than 180° around its axis.

21. A method as claimed in claim 13, wherein the step of polishing the end of the fiber comprises:

rough polishing in which the fiber tip is placed in contact with a polishing wheel while being rotated around its axis to form a lower polished region; and finish polishing in which the fiber tip is placed in contact with a polishing wheel while being rotated around its axis on a finer grit polishing surface.

22. A method of shaping an end of an optical fiber, the method comprising:

aligning an axial end of the optical fiber with respect to a polishing medium;

polishing the end of the optical fiber using at least two different grits on a surface of the polishing medium, the polishing medium rotating about an axis and having a first grit nearer its center of rotation different than a second grit further away from its center of rotation.

23. A method as in claim 22, wherein the polishing medium is a rotating polishing wheel.

24. A method as in claim 23, wherein the end of the optical fiber is axially rotated to produce a taper.

25. A method as in claim 24, wherein an angle of a taper at the end of the fiber is between about 16° and 20°.

26. A method as in claim 23, wherein a taper is produced at the end of the fiber by multiple offset axial rotations of the fiber against the polishing medium.

27. A method as in claim 23 further comprising:

polishing the end of the fiber by axially rotating the fiber against the polishing medium.

28. A method as in claim 27, wherein the fiber is polished at a first selected radial distance from a center of the polishing wheel and a successive step of polishing the end of the fiber is performed at a second selected radial distance from the center of the polishing wheel.

29. A method as in claim 28, wherein the fiber is axially rotated and offset from one step of polishing the fiber to another.

30. A method as in claim 27, wherein the fiber is axially rotated and offset from one step of polishing the fiber to another.

31. A method as in claim 22, wherein the polishing medium rotates about an axis and has a finer grit surface near its center of rotation than away from its center of rotation.

32. A method as in claim 31, wherein the surface of the polishing medium is flat.

33. A method for manufacturing a lens at an end of an optical fiber, the method comprising:

polishing the end of the fiber while rotating the optical fiber around its axis to form a lower polished region and an upper polished region such that a vertex angle of the lower polished region is smaller than a vertex angle of the upper polished region; and fusing a tip.

34. A method for manufacturing a lens at an end of an optical fiber, the method comprising:

polishing the end of the fiber while rotating the optical fiber around its axis so that a vertex angle of a lower polished region is between 16° and 20° and a vertex angle of an upper polished region is between 44° and 50°; and fusing a tip.

* * * * *